(12) United States Patent
Chiou

(10) Patent No.: US 9,000,467 B2
(45) Date of Patent: Apr. 7, 2015

(54) NON-CHIP LED ILLUMINATION DEVICE

(71) Applicant: Dong Yang Chiou, Taipei (TW)

(72) Inventor: Dong Yang Chiou, Taipei (TW)

(*) Notice: Subject to any disclaimer, the term of this patent is extended or adjusted under 35 U.S.C. 154(b) by 0 days.

(21) Appl. No.: 13/939,228

(22) Filed: Jul. 11, 2013

(65) Prior Publication Data

US 2015/0014718 A1    Jan. 15, 2015

(51) Int. Cl.
| *H01L 33/44* | (2010.01) |
| *H01L 33/64* | (2010.01) |
| *H01L 33/20* | (2010.01) |
| *H01L 33/36* | (2010.01) |
| *H01L 33/38* | (2010.01) |
| *H01L 33/26* | (2010.01) |

(52) U.S. Cl.
CPC .............. *H01L 33/44* (2013.01); *H01L 33/64* (2013.01); *H01L 33/20* (2013.01); *H01L 33/36* (2013.01); *H01L 33/38* (2013.01); *H01L 33/26* (2013.01)

(58) Field of Classification Search
CPC ......... H01L 33/20; H01L 33/26; H01L 33/36; H01L 33/38; H01L 33/44; H01L 33/64
USPC ............................................. 257/98, E33.059
See application file for complete search history.

(56) References Cited

U.S. PATENT DOCUMENTS

| 4,241,281 | A | 12/1980 | Morimoto et al. | |
|---|---|---|---|---|
| 4,703,219 | A | 10/1987 | Mesquida | |
| 5,187,547 | A | 2/1993 | Niina et al. | |
| 7,645,052 | B2 | 1/2010 | Villard | |
| 7,931,517 | B2 | 4/2011 | Yang et al. | |
| 7,954,975 | B2 | 6/2011 | Zhou | |
| 2006/0227532 | A1* | 10/2006 | Ko et al. | 362/85 |
| 2006/0255352 | A1* | 11/2006 | Lin et al. | 257/98 |
| 2010/0207142 | A1* | 8/2010 | Chen et al. | 257/98 |
| 2011/0049538 | A1* | 3/2011 | Yang | 257/88 |
| 2012/0261681 | A1* | 10/2012 | Ooyabu et al. | 257/88 |

* cited by examiner

*Primary Examiner* — Michael Jung
*Assistant Examiner* — John P Dulka
(74) *Attorney, Agent, or Firm* — Charles E. Baxley

(57) ABSTRACT

A non-chip LED illumination device includes a retaining layer having one or more chambers for engaging with light emitting diode elements each of which include an outer surface and two terminals disposed on the outer surface of the light emitting diode element. A covering layer is engaged onto the retaining layer and the light emitting diode element and includes one or more openings aligned with the light emitting diode elements respectively. One or more fluorescent members of different colors are engaged into the openings of the covering layer for allowing the light generated by the light emitting diode elements to emit through the fluorescent members of different colors.

4 Claims, 5 Drawing Sheets

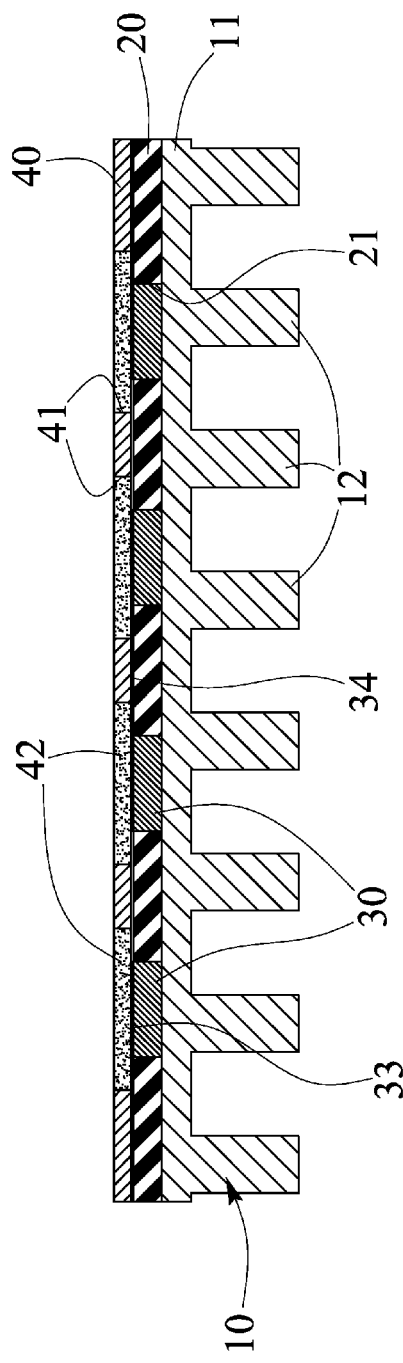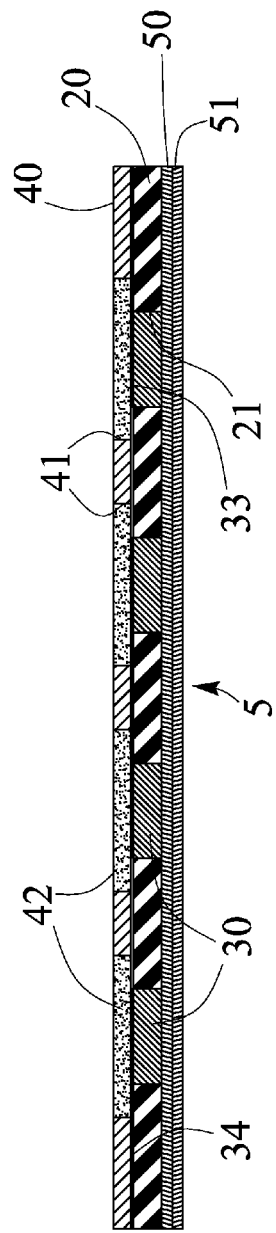

NON-CHIP LED ILLUMINATION DEVICE

BACKGROUND OF THE INVENTION

1. Field of the Invention

The present invention relates to an LED (Light Emitting Diode) illumination device, and more particularly to a non-chip LED illumination device including a structure for generating various light rays or different colors and/or for effectively dissipating the heat that may be generated by the light emitting diode elements and for suitably increasing the working life of the light emitting diode elements.

2. Description of the Prior Art

Typical LED light assemblies or devices comprise a receptacle or housing for attaching or mounting or securing or engaged into a supporting object or carrier, and one or more circuit boards disposed or attached or mounted or secured in the housing and including a number of LED light members for generating lights with greatly reduced electric energy and cost.

For example, U.S. Pat. No. 4,241,281 to Morimoto et al., U.S. Pat. No. 4,703,219 to Mesquida, U.S. Pat. No. 5,187,547 to Niina et al., U.S. Pat. No. 7,645,052 to Villard, U.S. Pat. No. 7,931,517 to Yang et al., and U.S. Pat. No. 7,954,975 to Zhou disclose several of the typical LED light assemblies or devices each also comprising a number of LED light members received or engaged in and attached or mounted or secured in an outer housing for attaching or mounting or securing or engaged into a ceiling or supporting object or carrier, and for generating lights with less electric energy.

However, the LED light members are normally exposed and may generate and emit strong lights that the user may feel dizzy and that the eyes of the user may feel tired or fatigued after a short term of using. In addition, the LED light members may not be used for generating various light rays or different colors.

The present invention has arisen to mitigate and/or obviate the afore-described disadvantages of the conventional LED illumination devices.

SUMMARY OF THE INVENTION

The primary objective of the present invention is to provide a non-chip LED illumination device including a structure for generating various light rays or different colors and/or for effectively dissipating the heat that may be generated by the light emitting diode elements and for suitably increasing the working life of the light emitting diode elements.

In accordance with one aspect of the invention, there is provided a non-chip LED illumination device comprising a retaining layer including a first chamber formed therein, a first light emitting diode element disposed and engaged into the first chamber of the retaining layer, and including an outer surface, and including two terminals provided on the outer surface of the first light emitting diode element, a covering layer engaged onto the retaining layer and the first light emitting diode element, and including a first opening formed therein and aligned with the first light emitting diode element, and a first fluorescent member engaged into the first opening of the covering layer for allowing the light generated by the first light emitting diode element to emit through the first fluorescent member.

The retaining layer may further include at least one second chamber formed therein, and at least one second light emitting diode element is disposed and engaged into the second chamber of the retaining layer, and includes an outer surface, and includes two terminals provided on the outer surface of the second light emitting diode element, and a conductor electrically connects the first and the second light emitting diode element together either in series or in parallel to each other.

The covering layer includes at least one second opening formed therein and aligned with the second light emitting diode element, and a second fluorescent member is engaged into the second opening of the covering layer, and preferably includes a color different from that of the first fluorescent member. The conductor may be selected from a silver glue or the like.

A heat dissipating device may further be provided and attached to the retaining layer and the first light emitting diode element for dissipating the heat that may be generated by the light emitting diode elements and for suitably increasing the working life of the light emitting diode elements. The heat dissipating device includes a base panel attached to the retaining layer and the first light emitting diode element, and a plurality of fins extended from the base panel for heat dissipating purposes.

A substrate may further be provided and selectively attached to the retaining layer and the first light emitting diode element. The substrate includes a release layer, and an adhering layer attached to the release layer. The adhering layer may be made of polyethylene terephthalate (PET) or the like.

Further objectives and advantages of the present invention will become apparent from a careful reading of the detailed description provided hereinbelow, with appropriate reference to the accompanying drawings.

BRIEF DESCRIPTION OF THE DRAWINGS

FIG. 2 is a cross sectional view of the non-chip LED illumination device, taken along lines 2-2 of FIG. 1;

FIG. 5 is another cross sectional view similar to FIG. 2, illustrating the other arrangement of the non-chip LED illumination device.

DETAILED DESCRIPTION OF THE PREFERRED EMBODIMENT

Figure 1:
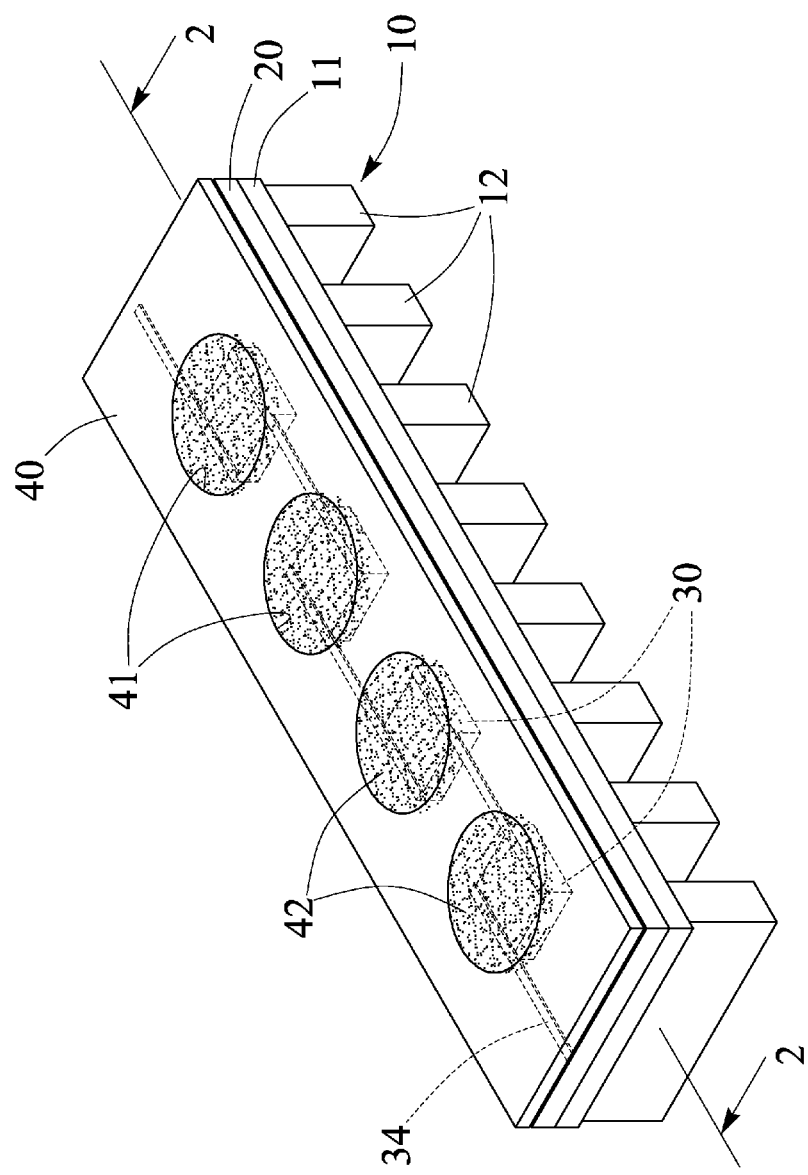
FIG. 1 is a perspective view of a non-chip LED illumination device in accordance with the present invention.
Figure 3:
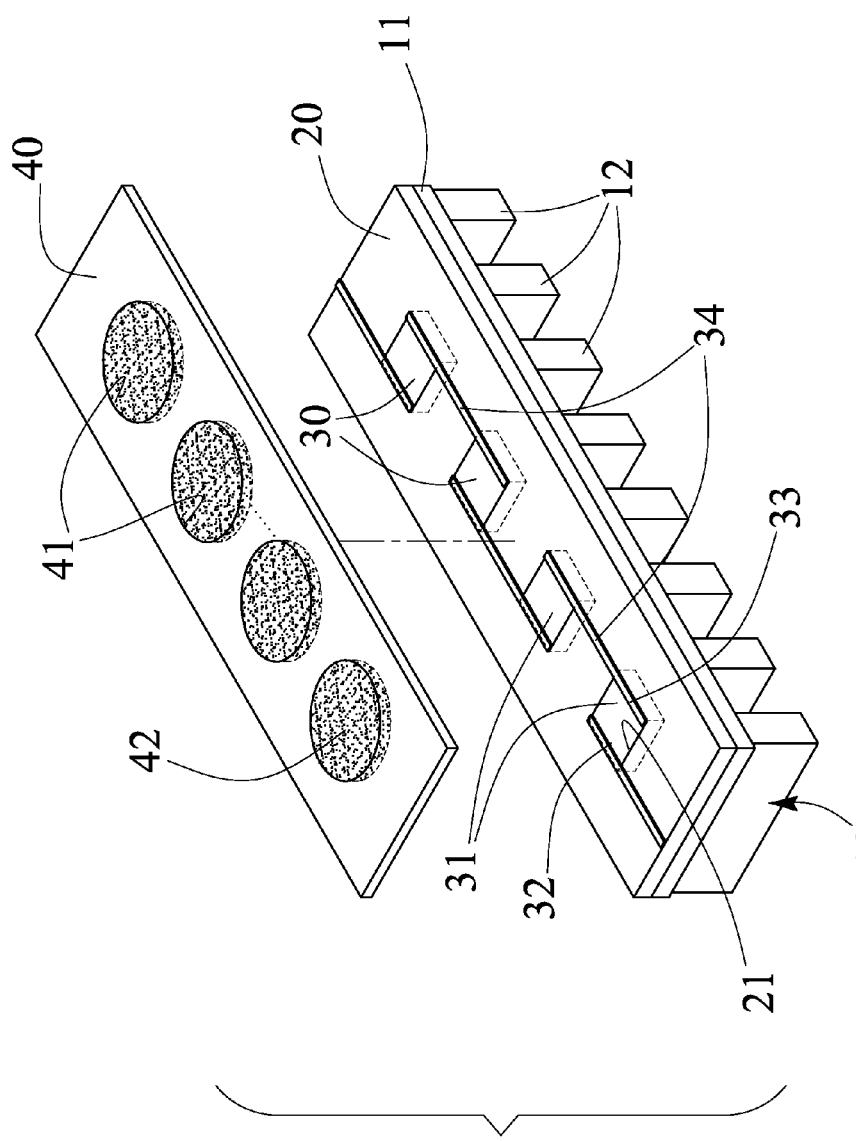
FIG. 3 is a partial exploded view of the non-chip LED illumination device.

Referring to the drawings, and initially to FIGS. 1-3, a non-chip LED illumination device in accordance with the present invention comprises a heat dissipating device 10 including a base panel 11 and one or more flaps or protrusions or fins 12 extended downwardly or outwardly therefrom for heat dissipating purposes, one or more light emitting diode elements 30 disposed or attached or mounted or secured on the base panel 11 of the heat dissipating device 10 and anchored or retained or secured or positioned to the heat dissipating device 10 with an adhering or anchoring or retaining rubber or plastic layer 20. For example, the retaining layer 20 includes one or more compartments or cavities or openings or chambers 21 formed therein for receiving or engaging with the light emitting diode elements 30 respectively and for adhering or anchoring or retaining or securing or positioning the light emitting diode elements 30 to the base panel 11 of the heat dissipating device 10.

Figure 4:
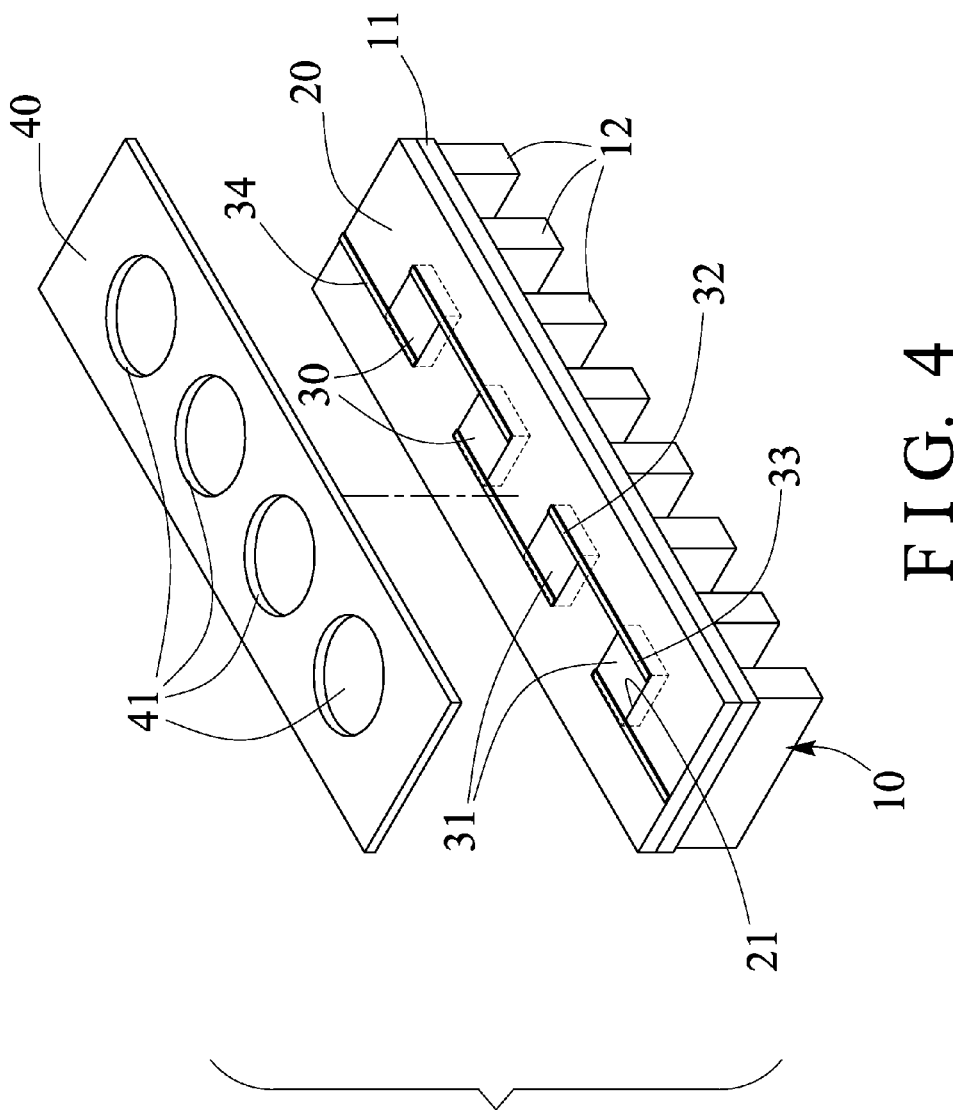
FIG. 4 is another partial exploded view similar to FIG. 3, illustrating the assembling operation of the non-chip LED illumination device.

As best shown in FIGS. 3 and 4, the light emitting diode elements 30 each include an outer portion or surface 31 flush with or slightly protruded out of the retaining layer 20, and each include two conductors or terminals 32, 33 formed or provided on the outer surface 31 thereof, and the terminals 32, 33 of the light emitting diode elements 30 are electrically connected or coupled together in series or in parallel to each other with electrical connecting or coupling rubber or plastic or silicon members or conductors 34 or the like; or the conductors 34 may be selected from silver glue or the like and may electrically connect or couple the light emitting diode elements 30 together in series or in parallel to each other, in which the conductors 34 are disposed or attached or mounted or secured or located on or above the retaining layer 20 for electrically connecting or coupling to the electric reservoir or electric power source or the like.

The non-chip LED illumination device further comprises an outer or covering plate or panel or flap or layer 40 to be disposed or attached or mounted or secured or located or engaged or adhered onto the retaining layer 20 and/or the light emitting diode elements 30 and/or the conductors 34 for covering or shielding or protecting the retaining layer 20 and/or the light emitting diode elements 30 and/or the conductors 34, and for preventing the light emitting diode elements 30 from being contacted with the air and for preventing the light emitting diode elements 30 from being oxidized. The covering layer 40 includes one or more compartments or cavities or chambers or openings 41 formed therein and aligned with the light emitting diode elements 30 respectively for receiving or engaging with the fluorescent layers or materials or members 42 which include the fluorescent components or powders or particles of different colors mixed or blended with resin materials or the like.

In operation, the lights or light rays generated by the light emitting diode elements 30 may be lighted or emitted through the fluorescent members 42 of different colors, in which the fluorescent members 42 of the covering layer 40 are aligned with the light emitting diode elements 30 for generating the lights or light rays of different colors when the lights or light rays generated by the light emitting diode elements 30 are lighted or emitted through the fluorescent members 42 of different colors. The heat dissipating device 10 may be provided or used for dissipating the heat that may be generated by the light emitting diode elements 30 or the like and thus for increasing the working life of the light emitting diode elements 30. The terminals 32, 33 of the light emitting diode elements 30 and the conductors 34 are sandwiched or covered or shielded or protected between the retaining layer 20 and the covering layer 40.

Figure 6:
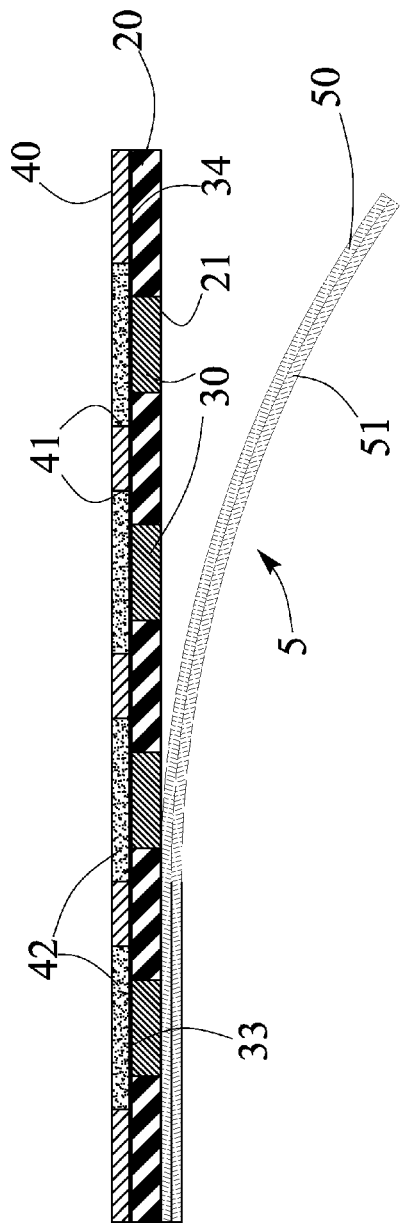
FIGS. 6, 7 are cross sectional views of the non-chip LED illumination device similar to FIG. 5, illustrating the formation of the non-chip LED illumination device.
Figure 7:
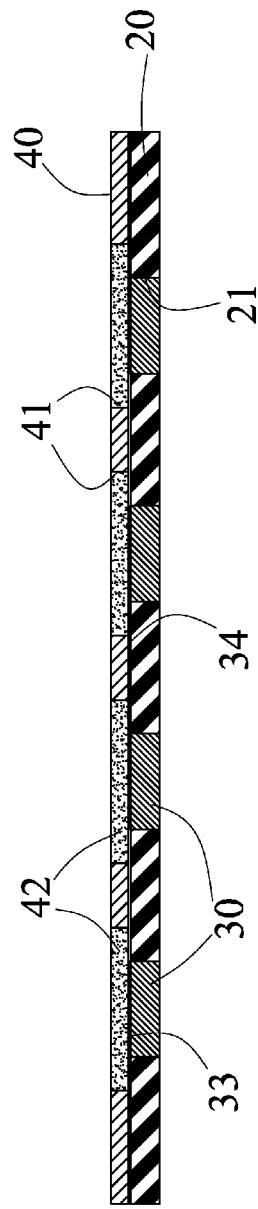

The heat dissipating device 10 may also be removed or separated from the retaining layer 20 and the light emitting diode elements 30, best shown in FIG. 7, and as shown in FIGS. 5 and 6, a back up layer or support or substrate 5 may further be provided and selectively attached or mounted or secured or adhered to the bottom of the retaining layer 20 and the light emitting diode elements 30 when the heat dissipating device 10 is removed or separated from the retaining layer 20 and the light emitting diode elements 30, and the substrate 5 may include a release layer 50 made of silicon materials or the like, and an adhering layer 51 attached or mounted or secured to the release layer 50 and made of polyethylene terephthalate (PET) or the like, and the substrate 5 may be selectively removed or separated from the retaining layer 20 and the light emitting diode elements 30 (FIGS. 6, 7) when the retaining layer 20 and the light emitting diode elements 30 are required to be attached or mounted or secured to the other supporting object or carrier.

It is to be noted that the light emitting diode elements 30 may be adhered or anchored or retained or secured or positioned to and on the base panel 11 of the heat dissipating device 10 with the retaining layer 20, without being packaged or sealed with an outer packaging or sealing or outer covering layer, for allowing the heat dissipating device 10 to effectively dissipate the heat that may be generated by the light emitting diode elements 30 or the like and thus for increasing the working life of the light emitting diode elements 30, and the covering layer 40 may suitably cover or shield or protect the retaining layer 20 and the light emitting diode elements 30 and the conductors 34, without packaging or sealing the light emitting diode elements 30 with an outer packaging or sealing or outer covering layer that is required by the chip-type seal of the typical LED illumination device.

Accordingly, the non-chip LED illumination device in accordance with the present invention includes a structure for generating various light rays or different colors and/or for effectively dissipating the heat that may be generated by the light emitting diode elements and for increasing the working life of the light emitting diode elements.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A non-chip LED illumination device comprising:
   a retaining layer including a first chamber formed therein, and including at least one second chamber formed therein,
   a first light emitting diode element disposed and engaged into said first chamber of said retaining layer, and including an outer surface, and including two terminals provided on said outer surface of said first light emitting diode element,
   at least one second light emitting diode element disposed and engaged into said at least one second chamber of said retaining layer, and including an outer surface, and including two terminals provided on said outer surface of said at least one second light emitting diode element,
   a conductor electrically connecting said first and said at least one second light emitting diode element together, said conductor being selected from a silver glue,
   a heat dissipating device attached to said retaining layer and said first and said at least one second light emitting diode elements for heat dissipating purposes, said heat dissipating device including a base panel attached to said retaining layer and said first and said at least one second light emitting diode elements, and a plurality of fins extended from said base panel for heat dissipating purposes,
   a covering layer engaged onto said retaining layer and said first light emitting diode element, and including a first opening formed therein and aligned with said first light emitting diode element, and said covering layer including at least one second opening formed therein and aligned with said at least one second light emitting diode element,
   a first fluorescent member engaged into said first opening of said covering layer for allowing a light generated by said first light emitting diode element to emit through said first fluorescent member, and a second fluorescent member engaged into said at least one second opening of said covering layer.

2. The non-chip non-chip LED illumination device as claimed in claim 1, wherein a substrate is selectively attached to said retaining layer and said first light emitting diode element.

3. A non-chip LED illumination device comprising:

a retaining layer including a first chamber formed therein, and including at least one second chamber formed therein, a first light emitting diode element disposed and engaged into said first chamber of said retaining layer, and including an outer surface, and including two terminals provided on said outer surface of said first light emitting diode element, at least one second light emitting diode element disposed and engaged into said at least one second chamber of said retaining layer, and including an outer surface, and including two terminals provided on said outer surface of said at least one second light emitting diode element, a substrate selectively attached to said retaining layer and said first light emitting diode element, said substrate including a release layer, and an adhering layer attached to said release layer, a conductor electrically connecting said first and said at least one second light emitting diode element together, a heat dissipating device attached to said retaining layer and said first and said at least one second light emitting diode elements for heat dissipating purposes, said heat dissipating device including a base panel attached to said retaining layer and said first and said at least one second light emitting diode elements, and a plurality of fins extended from said base panel for heat dissipating purposes, a covering layer engaged onto said retaining layer and said first light emitting diode element, and including a first opening formed therein and aligned with said first light emitting diode element, and said covering layer including at least one second opening formed therein and aligned with said at least one second light emitting diode element, a first fluorescent member engaged into said first opening of said covering layer for allowing a light generated by said first light emitting diode element to emit through said first fluorescent member, and a second fluorescent member engaged into said at least one second opening of said covering layer.

4. The non-chip LED illumination device as claimed in claim 3, wherein said adhering layer is made of polyethylene terephthalate (PET).

* * * * *